US012633503B2

(12) United States Patent
Sasaki

(10) Patent No.: US 12,633,503 B2
(45) Date of Patent: May 19, 2026

(54) PLASMA PROCESSING APPARATUS

(71) Applicant: Tokyo Electron Limited, Tokyo (JP)

(72) Inventor: Ryo Sasaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 939 days.

(21) Appl. No.: 17/894,853

(22) Filed: Aug. 24, 2022

(65) Prior Publication Data

US 2023/0069117 A1      Mar. 2, 2023

(30) Foreign Application Priority Data

Aug. 25, 2021    (JP) ................................. 2021-137377

(51) Int. Cl.
*H01J 37/32*              (2006.01)

(52) U.S. Cl.
CPC .. *H01J 37/32642* (2013.01); *H01J 37/32174* (2013.01); *H01J 2237/334* (2013.01)

(58) Field of Classification Search
CPC ........... H01J 37/32642; H01J 37/32715; H01J 37/32724; H01J 2237/327; C23C 16/4586; C23C 16/46; C23C 16/5096
See application file for complete search history.

(56) References Cited

U.S. PATENT DOCUMENTS

| | | | | | |
|---|---|---|---|---|---|
| 9,349,618 | B2 * | 5/2016 | Yamawaku | ....... | H01J 37/32477 |
| 2009/0229759 | A1 * | 9/2009 | Ogasawara | ....... | H01J 37/32642 |
| | | | | | 156/345.51 |

| | | | | | |
|---|---|---|---|---|---|
| 2010/0304572 | A1 * | 12/2010 | Koshimizu | ....... | H01J 37/32091 |
| | | | | | 156/345.28 |
| 2017/0256435 | A1 * | 9/2017 | Joubert | ............. | H01J 37/32642 |
| 2018/0218884 | A1 * | 8/2018 | Yamawaku | ....... | H01J 37/32642 |
| 2021/0090935 | A1 * | 3/2021 | Koai | ................. | H01L 21/68721 |

FOREIGN PATENT DOCUMENTS

| | | |
|---|---|---|
| JP | 2010-283028 A | 12/2010 |
| JP | 2018-206913 A | 12/2018 |
| JP | 2020-096136 A | 6/2020 |
| JP | 2021-015930 A | 2/2021 |
| JP | 2021-061390 A | 4/2021 |
| WO | 2020/106354 A1 | 5/2020 |

\* cited by examiner

*Primary Examiner* — Aiden Lee

(74) *Attorney, Agent, or Firm* — XSENSUS LLP

(57)                ABSTRACT

A plasma processing apparatus includes: a stage including a substrate placing portion and a peripheral portion surrounding the substrate placing portion; a focus ring placed on the peripheral portion of the stage; a cover ring surrounding an outer periphery of the stage; a conductive ring placed on the cover ring; a radio-frequency power supply coupled to the stage; first and second power supply lines electrically connected to the focus ring and the conductive ring, respectively; and a DC power supply electrically connected to the focus ring and the conductive ring via the first and second power supply lines, respectively. A first surface on an outer periphery of the focus ring and a second surface on an inner periphery of the conductive ring are separated from each other to face each other. The cover ring includes a separating portion that separates the focus ring and the conductive ring.

18 Claims, 9 Drawing Sheets

PLASMA PROCESSING APPARATUS

CROSS-REFERENCE TO RELATED APPLICATIONS

This application is based on and claims priority from Japanese Patent Application No. 2021-137377 filed on Aug. 25, 2021 with the Japan Patent Office, the disclosure of which is incorporated herein in its entirety by reference.

TECHNICAL FIELD

An embodiment of the present disclosure relates to a plasma processing apparatus.

BACKGROUND

A plasma processing apparatus that performs a substrate processing may have a configuration including a focus ring and a cover ring, for example, as disclosed in Japanese Patent Laid-Open Publication No. 2018-206913. By disposing the conductive focus ring so as to surround the periphery of the semiconductor substrate, the discontinuity of the bias potential at the end portion of the substrate is alleviated, and the uniformity of the plasma processing is improved. A cover ring made of quartz is provided around the focus ring (also referred to as an edge ring).

SUMMARY

The present disclosure is to provide a technique to reduce a potential difference between a focus ring and a conductive member provided in the vicinity of the outer side of the focus ring, which may occur during a plasma processing.

In one embodiment, a plasma processing apparatus is provided. The plasma processing apparatus includes a stage, a focus ring, a cover ring, a conductive ring, a radio-frequency power supply, a first power supply line, a second power supply line, and a DC power supply. The stage includes a substrate placing portion on which a substrate is placed, and a peripheral portion surrounding the substrate placing portion. The focus ring is placed on the peripheral portion of the stage and is conductive. The cover ring surrounds an outer periphery of the stage and is made of a dielectric. The conductive ring is placed on the cover ring. The radio-frequency power supply is coupled to the stage. The first power supply line is electrically connected to the focus ring. The second power supply line is electrically connected to the conductive ring. The DC power supply is electrically connected to the focus ring via the first power supply line, and is electrically connected to the conductive ring via the second power supply line. The DC power supply is configured to apply the same or a different DC voltage to each of the focus ring and the conductive ring. A first surface on an outer peripheral portion of the focus ring and a second surface on an inner peripheral portion of the conductive ring are separated from each other to face each other. The cover ring includes a separating portion that separates the focus ring and the conductive ring.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
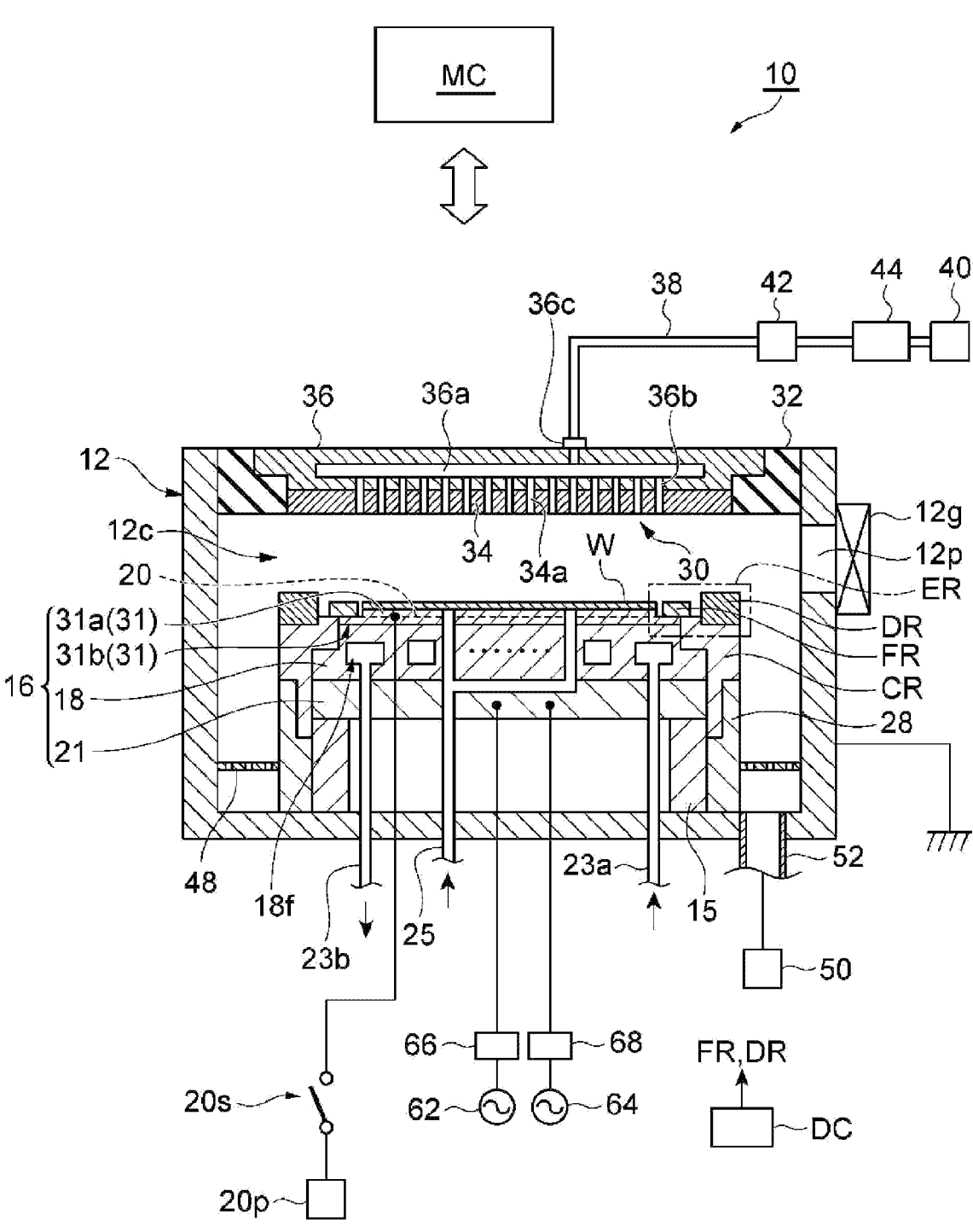
FIG. 1 is a view illustrating an example of a configuration of a plasma processing apparatus according to one embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, various embodiments will be described.

An etching technique using a plasma processing apparatus may be required to have high power required for improving productivity. In this case, it is required to respond to problems such as accelerated consumption of parts in a chamber and an increase in particles due to an increase in sputtering. In order to respond to the problems, a conductive ring (conductive member) made of a conductor material having high durability. The conductive ring is provided on a cover ring, and may form a capacitor with an outer peripheral portion of the focus ring. In a plasma processing, similarly to the focus ring, an offset potential (Vdc) may be generated in the conductive ring. In a process with a lot of deposits (deposition), in order to generate a higher Vdc to increase the sputtering, it is conceivable to reduce the capacitance between the focus ring and the conductive ring. However, in this case, the potential difference (electric field in the capacitor) between the focus ring and the conductive ring becomes stronger, and thus a discharge may occur between the focus ring and the conductive ring.

In one embodiment, a plasma processing apparatus is provided. The plasma processing apparatus includes a stage, a focus ring, a cover ring, a conductive ring, a radio-frequency power supply, a first power supply line, a second power supply line, and a DC power supply. The stage includes a substrate placing portion on which a substrate is placed, and a peripheral portion surrounding the substrate placing portion. The focus ring is placed on the peripheral portion of the stage and is conductive. The cover ring surrounds an outer periphery of the stage and is made of a dielectric. The conductive ring is placed on the cover ring.

The radio-frequency power supply is coupled to the stage. The first power supply line is electrically connected to the focus ring. The second power supply line is electrically connected to the conductive ring. The DC power supply is electrically connected to the focus ring via the first power supply line, and is electrically connected to the conductive ring via the second power supply line. The DC power supply is configured to apply the same or a different DC voltage to each of the focus ring and the conductive ring. A first surface on an outer peripheral portion of the focus ring and a second surface on an inner peripheral portion of the conductive ring are separated from each other to face each other. The cover ring includes a separating portion that separates the focus ring and the conductive ring.

As described above, the plasma processing apparatus having the above configuration has a configuration in which the same or the different DC voltage may be applied from the DC power supply to each of the focus ring and the conductive ring via the first power supply line and the second power supply line. Therefore, the potential difference between the focus ring and the conductive ring is reduced or eliminated by the DC voltage supplied via each of the first power supply line and the second power supply line.

In one embodiment, an inner peripheral portion of the focus ring is supported by the peripheral portion of the stage. The outer peripheral portion of the focus ring covers an upper surface of an inner peripheral portion of the cover ring.

In one embodiment, the focus ring and the conductive ring are capacitively coupled to each other on the first surface and the second surface.

In one embodiment, a distance between the first surface and the second surface is larger than zero, and smaller than a thickness of the focus ring.

In one embodiment, a lower surface of the inner peripheral portion of the conductive ring is positioned below a lower surface of the outer peripheral portion of the focus ring.

In one embodiment, the separating portion is a step configured to abut on a side surface of the inner peripheral portion of the conductive ring, and formed on a surface of the cover ring.

In one embodiment, the separating portion is a groove portion formed on the surface of the cover ring. The lower surface of the inner peripheral portion of the conductive ring is accommodated in the groove portion.

In one embodiment, the first surface is a side surface of the outer peripheral portion of the focus ring. The second surface is a side surface of the inner peripheral portion of the conductive ring.

In one embodiment, the first surface is a lower surface of the outer peripheral portion of the focus ring. The second surface is an upper surface of the inner peripheral portion of the conductive ring.

In one embodiment, the side surface of the outer peripheral portion of the focus ring and the side surface of the inner peripheral portion of the conductive ring are separated from each other to face each other.

In one embodiment, an area of the upper surface of the inner peripheral portion of the conductive ring facing the lower surface of the outer peripheral portion of the focus ring is larger than an area of the side surface of the inner peripheral portion of the conductive ring facing the side surface of the outer peripheral portion of the focus ring.

In one embodiment, a gap between the lower surface of the outer peripheral portion of the focus ring and the upper surface of the inner peripheral portion of the conductive ring is narrower than a gap between the side surface of the outer peripheral portion of the focus ring and the side surface of the inner peripheral portion of the conductive ring.

In one embodiment, the first surface is an upper surface of the outer peripheral portion of the focus ring, and the second surface is the lower surface of the inner peripheral portion of the conductive ring.

In one embodiment, the DC power supply includes a first filter, a second filter, and a DC power source. The first filter is electrically connected to the focus ring via the first power supply line. The second filter is electrically connected to the conductive ring via the second power supply line. The DC power source is is electrically connected to the focus ring via the first filter and the first power supply line. The DC power source is electrically connected to the conductive ring via the second filter and the second power supply line. The DC power supply is configured to apply a common DC voltage to the focus ring and the conductive ring. The first filter and the second filter are configured to block an input of a radio-frequency output from the radio-frequency power supply to the DC power source.

In one embodiment, the DC power supply includes a first DC power source and a second DC power source. The first DC power source is electrically connected to the focus ring via the first power supply line. The first DC power source is configured to apply a DC voltage to the focus ring. The second DC power source is electrically connected to the conductive ring via the second power supply line. The second DC power source is configured to apply a DC voltage to the conductive ring. The first DC power source and the second DC power source are configured to output the DC voltage independently of each other.

In one embodiment, the plasma processing apparatus further includes a control unit. The control unit is configured to control the DC voltage output from each of the first DC power source and the second DC power source. The control unit controls the DC voltage output from each of the first DC power source and the second DC power source so as to reduce a potential difference between the focus ring and the conductive ring.

In one embodiment, the control unit controls the DC voltage output from each of the first DC power source and the second DC power source so as to align a potential of the focus ring and a potential of the conductive ring.

In one embodiment, the plasma processing apparatus includes a plurality of first power supply lines and a plurality of second power supply lines. The focus ring has a shape extending along the peripheral portion of the stage. The conductive ring has a shape extending to surround the focus ring. The plurality of first power supply lines are disposed to be separated from each other in a circumferential direction of the focus ring. The plurality of second power supply lines are disposed to be separated from each other in a circumferential direction of the conductive ring.

Hereinafter, various embodiments will be described in detail with reference to the drawings. In the respective drawings, the same or corresponding parts will be denoted by the same symbols.

A plasma processing apparatus 1 according to the embodiment includes a chamber 10. The chamber 10 provides an internal space 12c therein. The chamber 10 includes a chamber body 12. The chamber body 12 has a substantially cylindrical shape. The material of the chamber body 12 may be, for example, aluminum. A film having corrosion resistance is provided on an inner wall surface of the chamber body 12. The material of the film may be ceramics such as aluminum oxide or yttrium oxide.

A passage 12p is formed at a side wall of the chamber body 12. A substrate W is transferred between the internal space 12c and the outside of the chamber 10 through the passage 12p. The passage 12p is opened/closed by a gate valve 12g provided along the side wall of the chamber body 12.

A cylindrical portion 28 is provided on the bottom portion of the chamber body 12. The material of the cylindrical portion 28 may be, for example, an insulating material. The cylindrical portion 28 has a substantially cylindrical shape. The cylindrical portion 28 extends upward from the bottom portion of the chamber body 12 in the internal space 12c.

In the internal space 12c, a support portion 15 extends upward from the bottom portion of the chamber body 12 along the inner side surface of the cylindrical portion 28 having a substantially cylindrical shape. The support portion 15 has a substantially cylindrical shape. The material of the support portion 15 may be, for example, an insulating material such as ceramics. A stage 16 is mounted on the support portion 15. The stage 16 is supported by the support portion 15. The stage 16 is configured to support the substrate W in the internal space 12c.

The stage 16 is provided on the support portion 15. The stage 16 includes a placing portion 31, a base 18, and an electrode plate 21.

The placing portion 31 includes a substrate placing portion 31a that is a region where the substrate W is placed, and a peripheral portion 31b that is a region surrounding the substrate placing portion 31a. A focus ring FR that is conductive is placed on the peripheral portion 31b. A conductive ring DR is placed on a cover ring CR in a concentric manner along an outer periphery OPc of the focus ring FR. The placing portion 31 may be constituted by an electrostatic chuck 20.

The cover ring CR is provided on the cylindrical portion 28. The cover ring CR is an insulator and extends along the outer periphery of the stage 16. The cover ring CR is provided to surround the outer periphery of the placing portion 31 when viewed from the above of the placing portion 31 (viewed from an upper electrode 30 side). The material of the cover ring CR is an insulating material, for example, ceramics such as quartz or alumina. The cover ring CR may be constituted by a plurality of dielectric parts.

The conductive ring DR is disposed above the cover ring CR. The conductive ring DR is provided to surround the focus ring FR when viewed from the above of the placing portion 31. The conductive ring DR has a substantially annular plate shape, and is made of a conductive material. The material of the conductive ring DR may be, for example, silicon (Si) or silicon carbide (SiC).

The electrode plate 21 is made of a conductive material such as aluminum, and has a substantially disc shape. The base 18 is provided on the electrode plate 21. The base 18 is made of a conductive material such as aluminum, and has a substantially disc shape. The base 18 is electrically connected to the electrode plate 21, and functions as a lower electrode.

The electrostatic chuck 20 is provided on the base 18 as the placing portion 31. The substrate W is placed on an upper surface of the electrostatic chuck 20. The electrostatic chuck 20 includes a body and an electrode. The body of the electrostatic chuck 20 has a substantially disc shape. The material of the body of the electrostatic chuck 20 is a dielectric. An electrode of the electrostatic chuck 20 is a film-like electrode, and is provided in the body of the electrostatic chuck 20. The electrode of the electrostatic chuck 20 is connected to a DC power supply 20p via a switch 20s. When a voltage from the DC power supply 20p is applied to the electrode of the electrostatic chuck 20, an electrostatic attractive force is generated between the electrostatic chuck 20 and the substrate W. The substrate W is held on the electrostatic chuck 20 by the electrostatic attractive force.

The focus ring FR is placed on the peripheral portion 31b to surround the outer periphery of the substrate W placed on the substrate placing portion 31a. The focus ring FR improves in-plane uniformity of a plasma processing on the substrate W. The focus ring FR has a substantially annular plate shape, and is made of a conductive material. The material of the focus ring FR may be, for example, silicon (Si) or silicon carbide (SiC).

A flow path 18f is provided inside the base 18. A heat exchange medium (e.g., a refrigerant) is supplied to the flow path 18f through a pipe 23a from a chiller unit (not illustrated) provided outside the chamber 10. The heat exchange medium supplied to the flow path 18f returns to the chiller unit through a pipe 23b. In the plasma processing apparatus 1, the temperature of the substrate W placed on the electrostatic chuck 20 is adjusted by the heat exchange between the heat exchange medium and the base 18.

A gas supply line 25 is provided in the plasma processing apparatus 1. The gas supply line 25 supplies a heat transfer gas (e.g., He gas) from a heat transfer gas supply mechanism to a gap between the upper surface of the electrostatic chuck 20 and the rear surface of the substrate W.

The plasma processing apparatus 1 further includes an upper electrode 30. The upper electrode 30 is provided above the stage 16. The upper electrode 30 is supported in the upper portion of the chamber body 12 via a member 32. The material of the member 32 may be an insulating material. The upper electrode 30 and the member 32 close an upper opening of the chamber body 12.

The upper electrode 30 may include an upper plate 34 and a support body 36. A lower surface of the upper plate 34 is the lower surface of the internal space 12c side, and defines the internal space 12c. The upper plate 34 may be made of a low resistance conductor or a semiconductor that generates low Joule heat. The upper plate 34 has a plurality of gas discharge holes 34a that penetrates the upper plate 34 in a plate thickness direction thereof.

The support body 36 supports the upper plate 34 to be freely detached/attached. The material of the support body 36 may be a conductive material such as aluminum. A gas diffusion chamber 36a is provided inside the support body 36. The support body 36 includes a plurality of gas holes 36b that extends downward from the gas diffusion chamber 36a. The plurality of gas holes 36b are communicated with the plurality of gas discharge holes 34a, respectively. A gas introducing port 36c is formed in the support body 36. The gas introducing port 36c is connected to the gas diffusion chamber 36a. A gas supply pipe 38 is connected to the gas introducing port 36c.

The gas supply pipe 38 is connected with a valve group 44, a flow rate controller group 42, and a gas source group 40. The gas source group 40, the valve group 44, and the flow rate controller group 42 constitute a gas supply unit. The gas source group 40 includes a plurality of gas sources. The valve group 44 includes a plurality of opening/closing valves. The flow rate controller group 42 includes a plurality of flow rate controllers. Each of the plurality of flow controllers of the flow controller group 42 is a mass flow controller or a pressure control type flow controller. Each of the plurality of gas sources of the gas source group 40 is connected to the gas supply pipe 38 via a corresponding opening/closing valve of the valve group 44 and a corresponding flow rate controller of the flow rate controller group 42.

A baffle plate 48 is provided between the cylindrical portion 28 and the side wall of the chamber body 12. The baffle plate 48 is configured by, for example, forming a film (e.g., a film of yttrium oxide) having corrosion resistance on the surface of a base material made of aluminum. A plurality of through-holes is formed in the baffle plate 48. An exhaust port is provided at the bottom of the chamber body 12 below the baffle plate 48. An exhaust device 50 is connected to the exhaust port via an exhaust pipe 52. The exhaust device 50 includes a vacuum pump such as a pressure adjusting valve and a turbo molecular pump.

The plasma processing apparatus 1 includes a first radio-frequency power supply 62 and a second radio-frequency power supply 64. The first radio-frequency power supply 62 generates a first radio-frequency power. The first radio-frequency power has a frequency suitable for plasma generation. The frequency of the first radio-frequency power is, for example, a frequency within a range of 27 [MHz] to 100 [MHz]. The first radio-frequency power supply 62 is connected to the base 18 via a matcher 66 and the electrode plate 21. The matcher 66 includes a circuit configured to match an output impedance of the first radio-frequency power supply 62 and an impedance of the load side (the base 18 side). The first radio-frequency power supply 62 may be connected to the upper electrode 30 via the matcher 66.

The second radio-frequency power supply 64 generates a second radio-frequency power. The second radio-frequency power has a frequency lower than the frequency of the first radio-frequency power. When the second radio-frequency power is used together with the first radio-frequency power, the second radio-frequency power is used as a radio-frequency power for bias for drawing ions into the substrate W. The frequency of the second radio-frequency power is, for example, a frequency within a range of 400 [kHz] to 13.56 [MHz]. The second radio-frequency power supply 64 is connected to the base 18 via a matcher 68 and the electrode plate 21. The matcher 68 includes a circuit configured to match an output impedance of the second radio-frequency power supply 64 and the impedance of the load side (the base 18 side). Further, instead of the second radio-frequency power, a DC voltage for bias for drawing ions into the substrate W may be applied. The DC voltage for the bias may be a negative voltage pulse. Further, the DC voltage for the bias may be applied to the electrode provided inside the electrostatic chuck 20.

It is possible to generate plasma using the second radio-frequency power without using the first radio-frequency power, that is, using a single radio-frequency power. In this case, the frequency of the second radio-frequency power may be a frequency larger than 13.56 [MHz], for example, 40 [MHz]. The plasma processing apparatus 1 may not include the first radio-frequency power supply 62 and the matcher 66.

In the plasma processing apparatus 1, a gas is supplied to the internal space 12c from the gas supply unit to generate plasma. A radio-frequency electric field is generated between the upper electrode 30 and the base 18 (lower electrode) by supplying at least one of the first radio-frequency power and the second radio-frequency power. The generated radio-frequency electric field generates plasma.

The plasma processing apparatus 1 may further include a control unit MC. The control unit MC may be a computer including, for example, a processor, a storage unit such as a memory, an input device, a display device, and a signal input/output interface. The control unit MC controls each unit of the plasma processing apparatus 1.

In the control unit MC, an operator may execute an input operation of a command using the input device to manage the plasma processing apparatus 1. Further, in the control unit MC, the display device may visualize and display an operation status of the plasma processing apparatus 1. Further, a control program and a recipe data are stored in the storage unit. The control program is executed by the processor, in order to execute various processings in the plasma processing apparatus 1. The processor executes the control program, and controls each component of the plasma processing apparatus 1 according to the recipe data.

Figure 2:
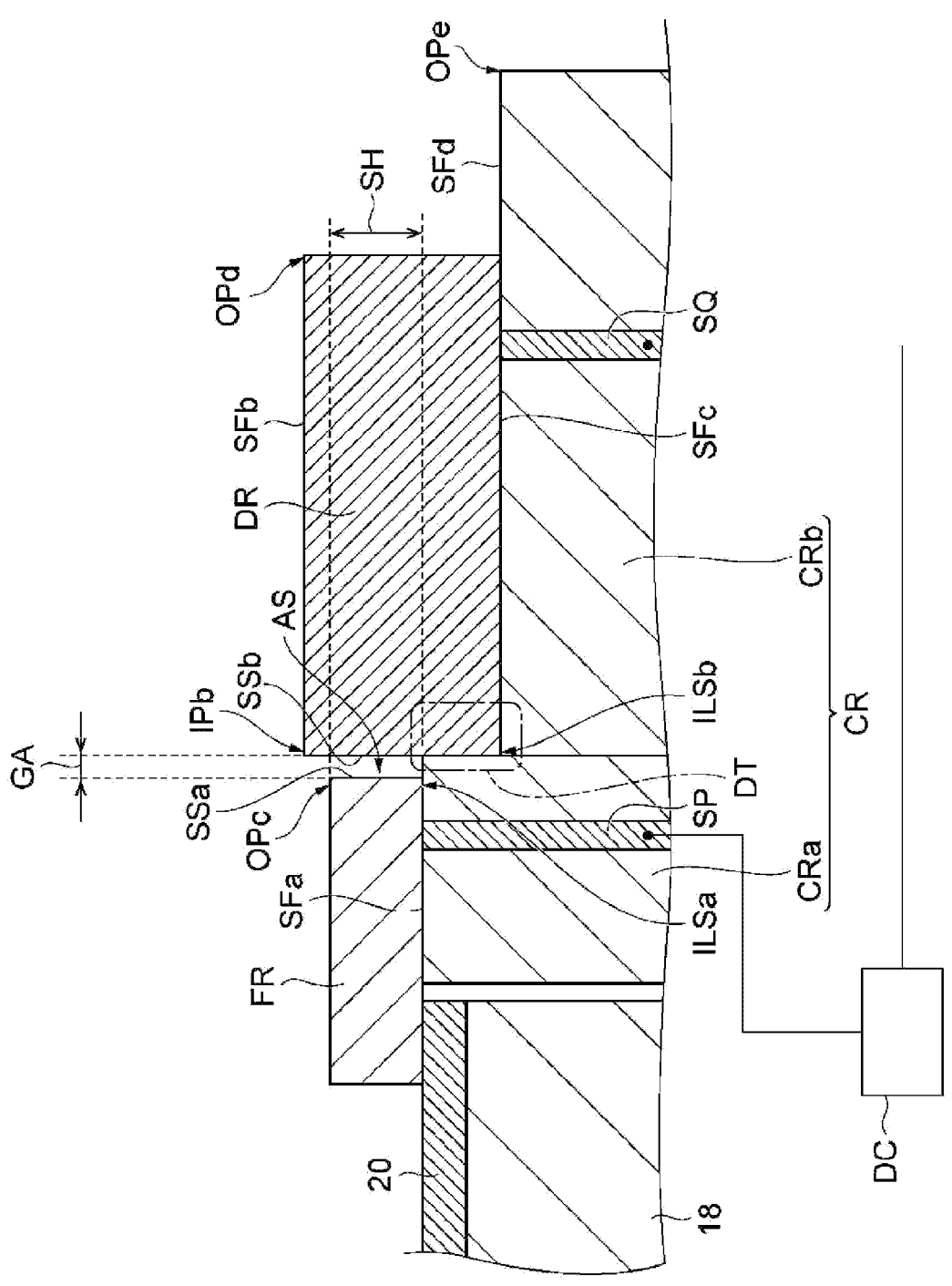
FIG. 2 is a view illustrating an example of a configuration of a conductive ring according to the embodiment.

Further referring to FIG. 2 together with FIG. 1, a configuration of a region ER of the stage 16 will be further described. Particularly, the configuration of the conductive ring DR and the focus ring FR will be described in detail.

As an example illustrated in FIG. 2, the cover ring CR is constituted by two dielectric members of an inner cover ring CRa and an outer cover ring CRb. The cover ring CR may be constituted by one dielectric member, or by three or more dielectric members.

The inner periphery side (inner peripheral portion) of the focus ring FR is placed on the electrostatic chuck 20, which is the peripheral portion 31b of the placing portion 31, and the outer periphery side (outer peripheral portion) is disposed to cover the inner cover ring CRa. The outer peripheral portion of the focus ring FR may be placed on the inner cover ring CRa. In order to reliably support the inner peripheral portion of the focus ring FR by the peripheral portion 31b, an upper surface SFa of the inner cover ring CRa may be formed to be lower than the upper surface of the peripheral portion 31b, and a gap may be formed between the lower surface of the outer peripheral portion of the focus ring FR and the upper surface SFa of the inner cover ring CRa. That is, the outer peripheral portion of the focus ring FR may not be placed on the inner cover ring CRa. The thickness of the body of the electrostatic chuck 20 is extremely small as compared with the thickness of the inner cover ring CRa. As a result, the focus ring FR is coupled to the first radio-frequency power supply 62 and the second radio-frequency power supply 64 via the electrostatic chuck 20 as a radio-frequency circuit.

A power supply line SP is electrically connected to the focus ring FR. A power supply line SQ is electrically connected to the conductive ring DR. A DC power supply DC is electrically connected to the focus ring FR via the power supply line SP and is electrically connected to the conductive ring DR via the power supply line SQ. The DC power supply DC is configured to apply the same or a different DC voltage to each of the focus ring FR and the conductive ring DR.

Figure 3:
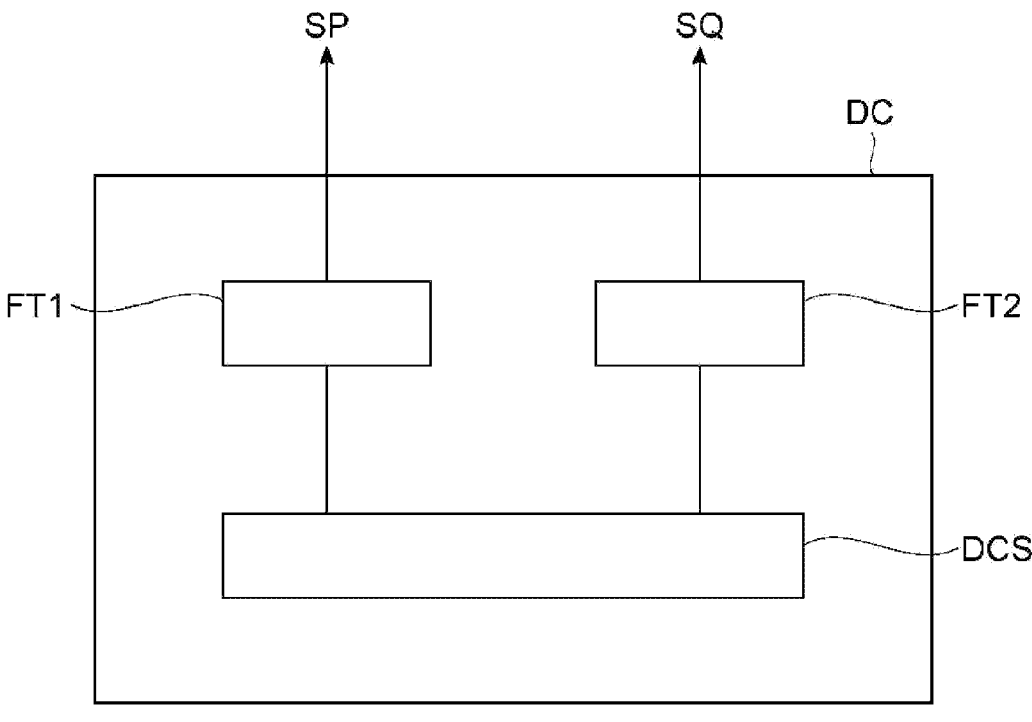
FIG. 3 is a view illustrating an example of a DC power supply (DC) illustrated in FIG. 1.
Figure 4:
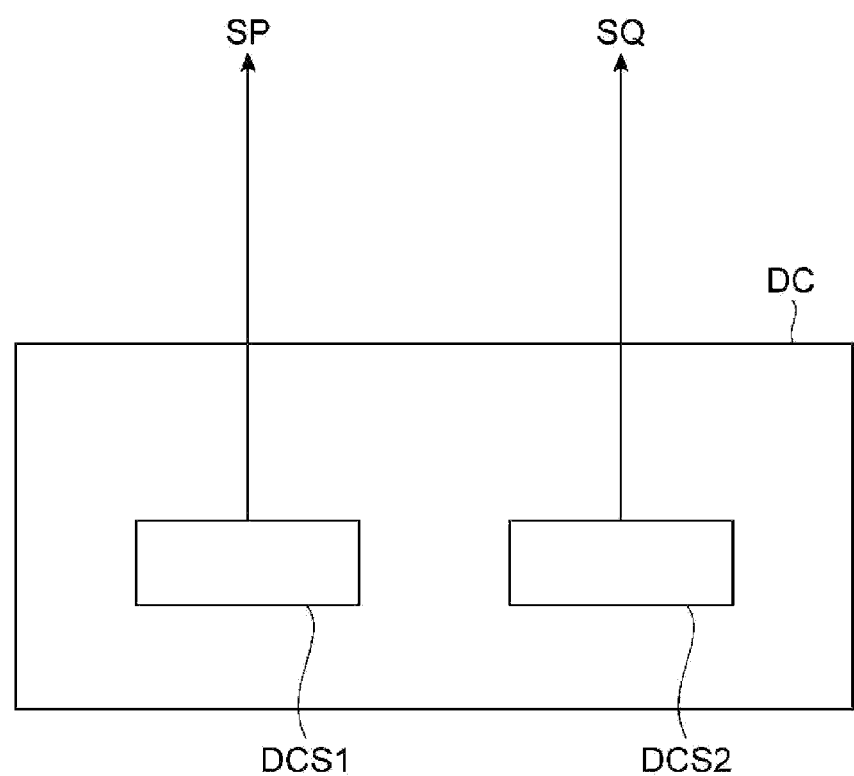
FIG. 4 is a view illustrating another example of the DC power supply (DC) illustrated in FIG. 1.

The DC power supply DC has one of a configuration illustrated in FIG. 3 and a configuration illustrated in FIG. 4. The configuration of the DC power supply DC will be described with reference to FIGS. 3 and 4. First, the configuration of the DC power supply DC illustrated in FIG. 3 will be described. The DC power supply DC includes a filter FT1, a filter FT2, and a DC power source DCS. The filter FT1 is electrically connected to the focus ring FR via the power supply line SP. The filter FT2 is electrically connected to the conductive ring DR via the power supply line SQ. The DC power source DCS is electrically connected to the focus ring FR via the filter FT1 and the power supply line SP. The DC power source DCS is electrically connected to the conductive ring DR via the filter FT2 and the power supply line SQ. The DC power source DCS is configured to apply a common DC voltage to the focus ring FR and the conductive ring DR. The filter FT1 and the filter FT2 are configured to block an input of a radio-frequency output from each of the first radio-frequency power supply 62 and the second radio-frequency power supply 62 to the DC power source DCS. For example, the filter FT1 blocks the radio-frequency input from the focus ring FR via the power supply line SP, and the filter FT2 blocks the radio-frequency input from the conductive ring DR via the power supply line SQ. Due to the filter FT1 and the filter FT2, the influence of the radio-frequency on the DC power source DCS may be reduced or eliminated. The control unit MC is configured to control the DC voltage output from the DC power source DCS.

As described above, the plasma processing apparatus including the DC power supply DC having the configuration illustrated in FIG. 3 has a configuration in which a common (same) DC voltage may be applied from the DC power supply DC via the power supply line SP and the power supply line SQ to each of the focus ring FR and the conductive ring DR. Therefore, the potential difference between the focus ring FR and the conductive ring DR is reduced by the DC voltage supplied via each of the power supply line SP and the power supply line SQ.

Descriptions will be made on an applying aspect of a DC voltage in the case where the plasma processing apparatus 1 includes the DC power supply DC having the configuration illustrated in FIG. 3. First, from an inclination (inclination from the vertical direction with respect to the substrate surface) of the groove formed at the end portion of the substrate on which an etching processing is performed in advance, a DC voltage (DC voltage output from the DC power source DCS) that is applied to the focus ring FR required to eliminate the inclination is acquired. For example, the correspondence relationship between the inclination of the groove and the DC voltage output from the DC power source DCS is provided in advance in a table. In a case where a plasma processing is being performed (where the radio-frequency is output from the first radio-frequency power supply 62 and the second radio-frequency power supply 64), the control unit MC controls the DC power source DCS so as to output the DC voltage acquired from the table.

Subsequently, the configuration of the DC power supply DC illustrated in FIG. 4 will be described. The DC power supply DC includes a DC power source DCS1 and a DC power source DCS2. The DC power source DCS1 is electrically connected to the focus ring FR via the power supply line SP. The DC power source DCS1 is configured to apply a DC voltage to the focus ring FR. The DC power source DCS2 is electrically connected to the conductive ring DR via the power supply line SQ. The DC power source DCS2 is configured to apply a DC voltage to the the conductive ring DR. The DC power source DCS1 and the DC power source DCS2 are configured to output the DC voltage independently of each other. The control unit MC is configured to control the DC voltage output from each of the DC power source DCS1 and the DC power source DCS2. The control unit MC controls the DC voltage output from each of the DC power source DCS1 and the DC power source DCS2 so as to reduce a potential difference between the focus ring FR and the conductive ring DR. For example, the control unit MC controls the DC voltage output from each of the DC power source DCS1 and the DC power source DCS2 so as to align the potential of the focus ring FR and the potential of the conductive ring DR.

As described above, the plasma processing apparatus including the DC power supply DC having the configuration illustrated in FIG. 4 has a configuration in which a different DC voltage may be applied from the DC power supply DC via the power supply line SP and the power supply line SQ to each of the focus ring FR and the conductive ring DR. Therefore, the potential difference between the focus ring FR and the conductive ring DR is reduced or eliminated by the DC voltage supplied via each of the power supply line SP and the power supply line SQ.

Descriptions will be made on an applying aspect of a DC voltage in the case where the plasma processing apparatus 1 includes the DC power supply DC having the configuration illustrated in FIG. 4. First, from an inclination (inclination from the vertical direction with respect to the substrate surface) of the groove formed at the end portion of the substrate on which an etching processing is performed in advance, a DC voltage required to eliminate the inclination is acquired. The acquired DC voltages are the DC voltage (DC voltage output from the DC power source DCS1) applied to the focus ring FR, and the DC voltage (DC voltage output from the DC power source DCS2) applied to the conductive ring DR. For example, the correspondence relationships between the inclination of the groove and the DC voltage output from the DC power source DCS1 and the DC voltage output from the DC power source DCS2 are provided in advance in a table. In a case where a plasma processing is being performed (where the radio-frequency is output from the first radio-frequency power supply 62 and the second radio-frequency power supply 64), the control unit MC controls the DC power source DCS1 and the DC power source DCS2 so as to output each of the DC voltages acquired from the table.

Descriptions will be made with reference to FIG. 2 again. The conductive ring DR is placed on the outer cover ring CRb. Since the thickness of the outer cover ring CRb is large, the conductive ring DR is not coupled to the first radio-frequency power supply 62 and the second radio-frequency power supply 64 via the outer cover ring CRb as a radio-frequency circuit.

The outer cover ring CRb includes an upper surface SFd of the inner periphery side and an upper surface SFc of the outer periphery side. Since the inner periphery side of the outer cover ring CRb is close to the focus ring FR, it is more likely to be consumed than the outer periphery side. Therefore, in the example in FIG. 2, the conductive ring DR is disposed so as to cover the site that is likely to be consumed (upper surface SFc of the inner periphery side of the outer cover ring CRb). That is, an outer periphery OPd of the conductive ring DR is disposed to be positioned on an inner side from an outer periphery OPe of the cover ring CR, and the upper surface of the outer periphery of the cover ring CR is exposed to the plasma processing space (inner space 12c). The conductive ring DR may be disposed to cover entire upper surface of the outer cover ring CRb. Further, in the example in FIG. 2, the upper surface SFd of the outer periphery side and the upper surface SFc of the inner periphery side covered with the conductive ring DR are configured to be flush with each other, but may not be flush with each other. For example, the upper surface SFd of the outer cover ring CRb that is not covered with the conductive ring DR may be higher than an upper surface SFb of the conductive ring DR, or may be at the same height.

As illustrated in FIG. 2, a gap AS is provided between the focus ring FR and the conductive ring DR. More specifically, a first side surface SSa of the outer periphery OPc of the focus ring FR and a second side surface SSb of an inner periphery IPb of the conductive ring DR are separated from each other to face each other. A lower surface ILSb of the inner periphery of the conductive ring DR is positioned below a lower surface ILSa of the outer periphery of the focus ring FR.

As the example illustrated in FIG. 2, it is configured such that the area of the second side surface SSb is smaller than the area of the upper surface SFb of the conductive ring DR. The upper surface SFb of the conductive ring DR is higher than the upper surface of the focus ring FR. In other words, the thickness of the inner periphery IPb of the conductive ring DR is thicker than the thickness of the outer periphery OPc of the focus ring FR.

A distance GA between the first side surface SSa and the second side surface SSb is a width of the gap AS. As will be described later, the first side surface SSa and the second side surface SSb function as capacitors. Therefore, the distance GA is larger than zero, and may be smaller than a thickness SH of the focus ring FR.

The cover ring CR further includes a separating portion DT. The separating portion DT separates the first side surface SSa of the focus ring FR and the second side surface SSb of the conductive ring DR.

As the example illustrated in FIG. 2, the upper surface SFc of the inner periphery side of the outer cover ring CRb is configured to be lower than the upper surface SFa of the inner cover ring CRa, and thus, a step portion is provided between the inner cover ring CRa and the outer cover ring CRb to form the separating portion DT. Since the step portion and the second side surface SSb of the conductive ring DR are in contact with each other, the second side surface SSb of the conductive ring DR and the first side surface SSa of the focus ring FR are not in contact with each other. That is, by providing the separating portion DT, it is possible to prevent the first side surface SSa and the second side surface SSb from being in contact with each other and not functioning as capacitors.

In the stage 16 having the above configuration, the conductive ring DR is disposed on the cover ring CR. Since the thickness of the cover ring CR is large compared to the thickness of the body of the electrostatic chuck 20, the conductive ring DR is not coupled to the first radio-frequency power supply 62 and the second radio-frequency power supply 64 via the cover ring CR as a radio-frequency circuit. Further, the first side surface SSa of the outer periphery OPc of the focus ring FR and the second side surface SSb of the inner periphery IPb of the conductive ring DR are separated from each other to face each other. Therefore, the first side surface SSa and the second side surface SSb function as capacitors. That is, the focus ring FR and the conductive ring DR are capacitively coupled at the first side surface SSa and the second side surface SSb. When a radio-frequency power is applied to the base 18, electrostatic induction occurs inside the conductive ring DR due to positive or negative charges existing on the first side surface SSa of the outer periphery OPc of the focus ring FR. As a result, charges equivalent and opposite to the charges collected on the second side surface SSb of the conductive ring DR are attracted to the potential of the plasma and is collected on the upper surface SFb of the conductive ring DR. Since the area of the upper surface SFb is larger than the area of the second side surface SSb, the amount of the charge per unit area existing on the upper surface SFb is smaller than the amount of the charge per unit area existing on the second side surface SSb. Therefore, the potential of the conductive ring DR is lower than the potential of the focus ring FR, and the acceleration of the ions in the plasma toward the conductive ring DR is reduced. Therefore, the conductive ring DR (i.e., outer region of the focus ring FR) is less likely to be sputtered.

The conductive ring DR is disposed to cover the site of the cover ring CR that is likely to be consumed, and is made of a material having higher resistance to the sputtering than the cover ring CR. Further, since the acceleration of the ions toward the conductive ring DR is reduced, the conductive ring DR itself is less likely to be sputtered. Therefore, the fluctuation of the area of the focus ring FR as a cathode may be suppressed by the consumption of the cover ring CR around the outer periphery of the focus ring FR. As a result, the process fluctuation such as occurrence of tilting at the end portion of the substrate may be suppressed.

Further, by adjusting the area of the upper surface SFb of the conductive ring DR, the potential of the upper surface SFb of the conductive ring DR may be adjusted.

Further, the conductive ring DR is disposed to face the first side surface SSa of the focus ring FR. Since an object (conductive ring DR) exists on the side of the first side surface SSa of the focus ring FR, the ions toward the first side surface SSa is blocked by the conductive ring DR. Therefore, since the focus ring FR is less likely to be sputtered from the first side surface SSa, it is possible to suppress the consumption of the focus ring FR.

Figure 5:
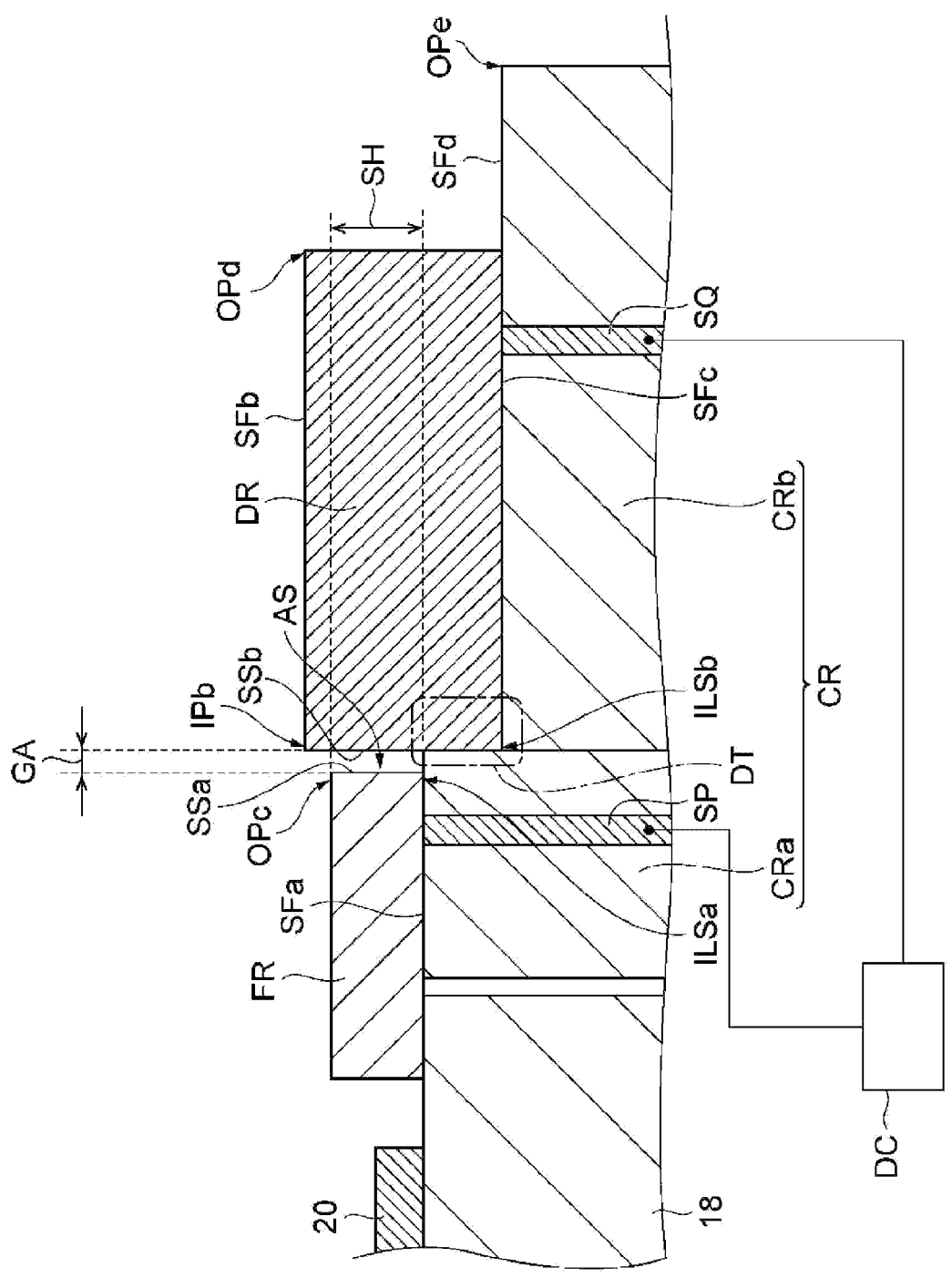
FIG. 5 is a view illustrating another example of the configuration of the conductive ring according to the embodiment.

As the example illustrated in FIG. 2, the substrate placing portion 31a and the peripheral portion 31b on which the focus ring FR is placed are configured as the electrostatic chuck 20, but the present disclosure is not limited thereto. The electrostatic chuck of the substrate placing portion 31a and the electrostatic chuck of the peripheral portion 31b may be provided independently of each other. Further, as illustrated in FIG. 5, the substrate placing portion 31a may be configured as the electrostatic chuck 20, and the peripheral portion 31b may be configured as the base 18. Further, not only the inner periphery side of the focus ring FR, but also the entire focus ring may be placed on the peripheral portion 31b. The peripheral portion 31b may be formed to be lower than the substrate placing portion 31a, or may be a step portion.

Figure 6:
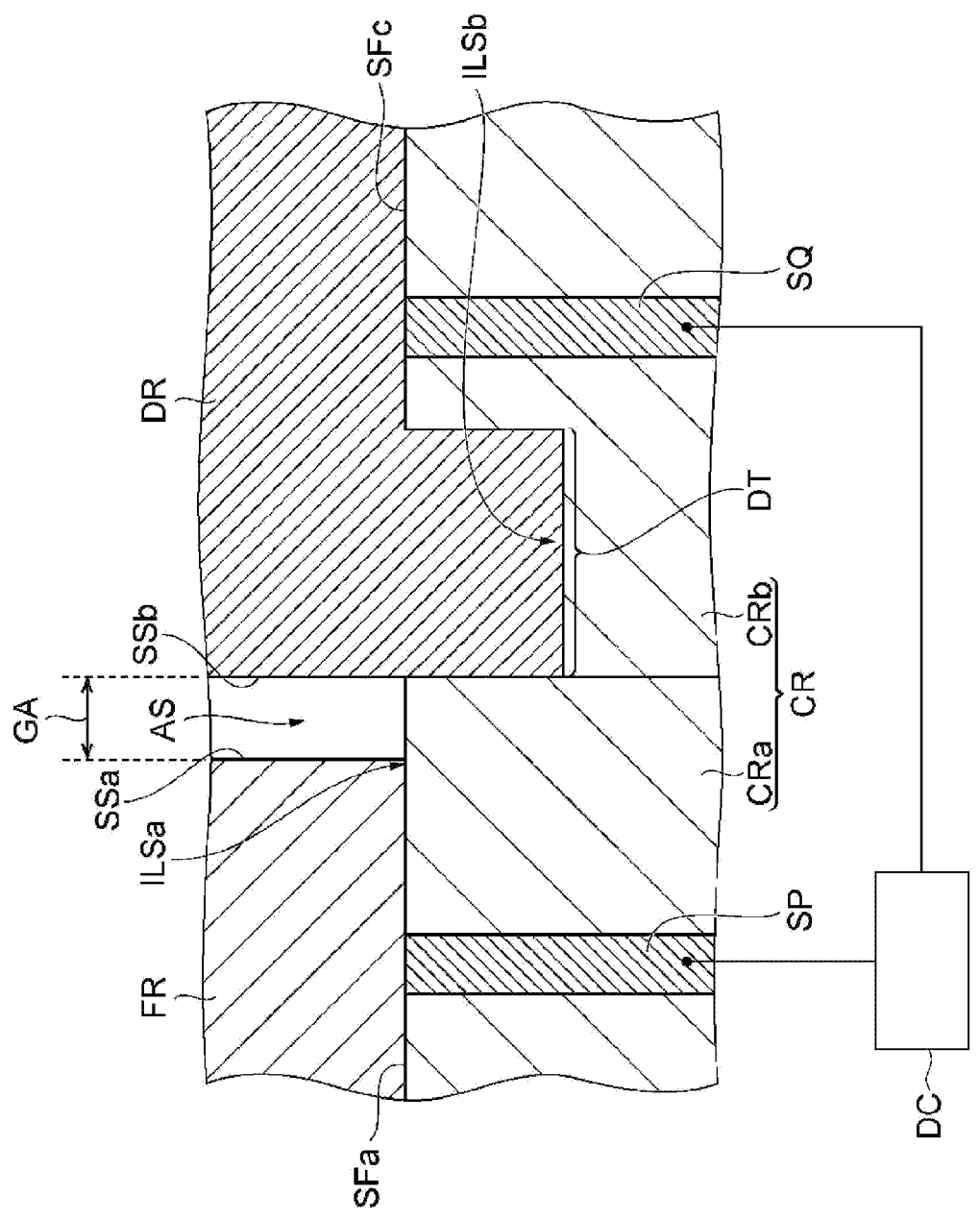
FIG. 6 is a view illustrating yet another example of the configuration of the conductive ring according to the embodiment.

As the example illustrated in FIG. 2, the separating portion DT is configured by configuring the upper surface SFC of the inner periphery side of the outer cover ring CRb to be lower than the upper surface SFa of the inner cover ring CRa, but the present disclosure is not limited thereto. As illustrated in FIG. 6, a concave-shaped groove may be provided in the cover ring CR on which the conductive ring DR is placed, and the lower surface ILSb of the inner periphery of the conductive ring DR may be provided in a convex shape to face downward. In this case, the lower surface ILSb of the inner periphery of the conductive ring DR is accommodated in the concave portion (groove) of the cover ring CR. The lower surface ILSb of the inner periphery having a convex shape is fitted into the concave-shaped groove, the position of the conductive ring DR with respect to the cover ring CR may be stably maintained. In FIG. 6, the groove is provided in the outer cover ring CRb as the separating portion DT, but the groove may be provided in the inner cover ring CRa. In this case, the inner periphery side of the conductive ring DR is placed on the inner cover ring CRa, and the outer periphery side of the conductive ring DR is placed on the outer cover ring CRb. Further, in FIG. 6, the upper surface SFa of the cover ring CR on which the focus ring FR is placed and the upper surface SFc of the cover ring CR on which the conductive ring DR is placed are configured to be at the same height, but may be configured to be at different heights. For example, the upper surface SFc of the cover ring CR on which the conductive ring DR is placed may be configured to be higher than the upper surface SFa of the cover ring CR on which the focus ring FR is placed.

Figure 7:
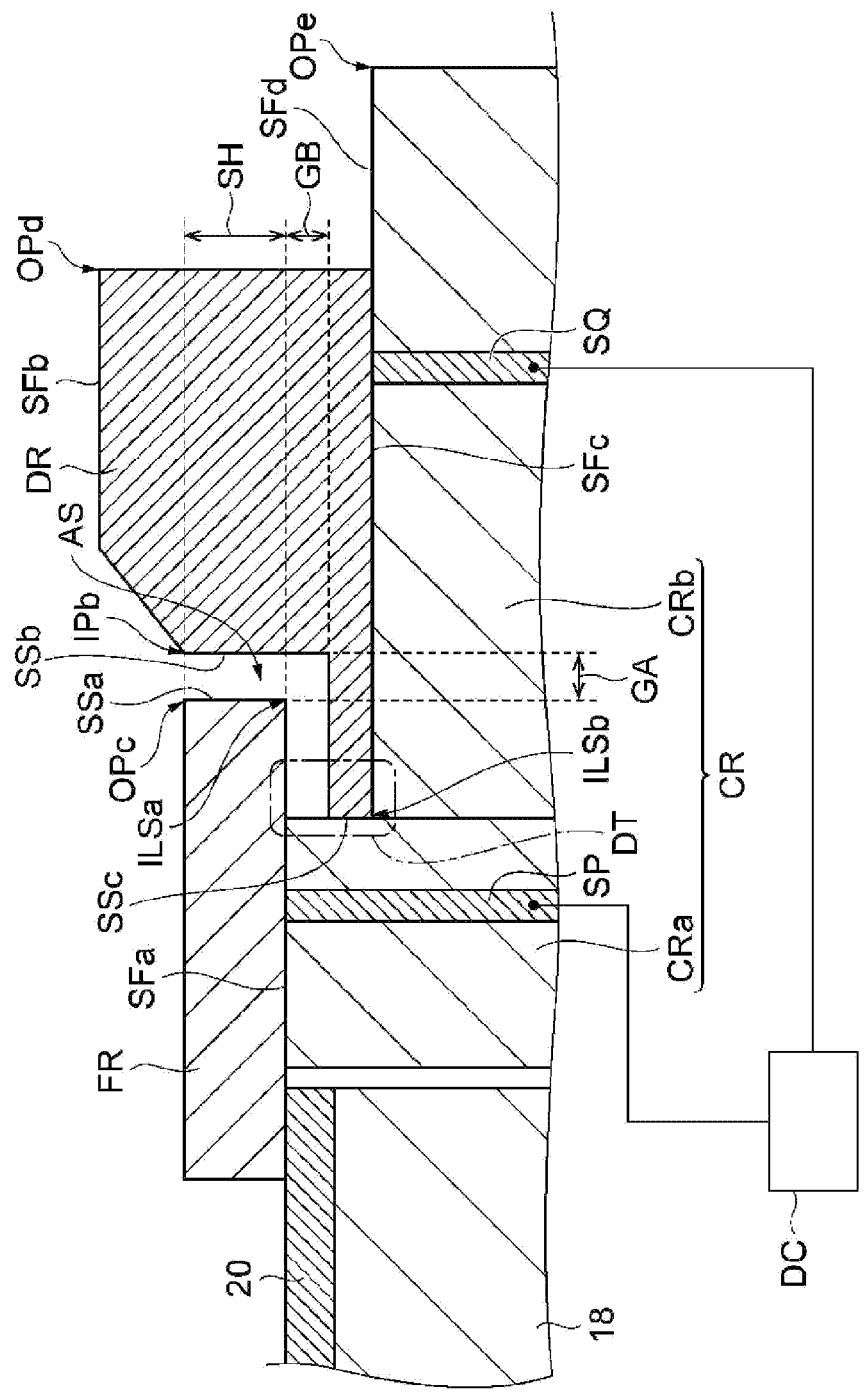
FIG. 7 is a view illustrating yet another example of the configuration of the conductive ring according to the embodiment.

Further, as the example illustrated in FIG. 2, the first side surface SSa of the focus ring FR and the second side surface SSb of the conductive ring DR are separated from each other to face each other so as to function as capacitors, but the present disclosure is not limited thereto. As illustrated in FIG. 7, the lower surface of the outer peripheral portion of the focus ring FR and the upper surface of the inner peripheral portion of the conductive ring DR may be configured to be separated from each other to face each other. In the conductive ring DR illustrated in FIG. 7, the lower portion of the inner peripheral portion protrudes to the inner periphery side. The upper surface of the lower inner peripheral portion of the conductive ring DR that protrudes and the lower surface of the focus ring FR are separated from each other to face each other. Further, the first side surface SSa of the focus ring FR and the second side surface SSb that is the side surface of the upper inner peripheral portion of the conductive ring DR are separated from each other to face each other.

The upper surface SFc of the inner periphery side of the outer cover ring CRb is lower than the upper surface SFa of the inner cover ring CRa, and a step portion serving as the separating portion DT is formed between the inner cover ring CRa and the outer cover ring CRb. Since a third side surface SSc that is the side surface of the lower inner peripheral portion of the conductive ring DR abuts on the step portion (side surface of the outer periphery of the inner cover ring CRa), the second side surface SSb that is the side surface of the upper inner peripheral portion of the conductive ring DR and the first side surface SSa of the focus ring FR are not in contact with each other. Further, the upper surface SFa of the inner cover ring CRa is formed at a position higher than the upper surface of the lower inner peripheral portion of the conductive ring DR. Therefore, since the lower surface of the focus ring FR abuts on the upper surface SFa of the inner cover ring CRa, the upper surface of the lower inner peripheral portion of the conductive ring DR and the lower surface of the focus ring are not in contact with each other.

As the example illustrated in FIG. 7, not only the first side surface SSa and the second side surface SSb, but also the lower surface of the outer peripheral portion of the focus ring FR and the upper surface of the lower inner peripheral portion of the conductive ring DR may function as capacitors. Therefore, the capacitance between the focus ring FR and the conductive ring DR may become large.

A distance GB between the lower surface of the outer peripheral portion of the focus ring FR and the upper surface of the lower inner peripheral portion of the conductive ring DR may be configured to be smaller than the distance GA between the first side surface SSa and the second side surface SSb. Since the distance GB is smaller than the distance GA, the capacitance between the lower surface of the outer peripheral portion of the focus ring FR and the upper surface of the lower inner peripheral portion of the conductive ring DR is larger than the capacitance between the first side surface SSa and the second side surface SSb. As a result, even if the areas of the first side surface SSa and the second side surface SSb are fluctuated due to the consumption of the focus ring FR and the conductive ring DR, the fluctuation of the capacitance between the focus ring FR and the conductive ring DR may be reduced. Further, since the distance GA between the first side surface SSa and the second side surface SSb may be increased, it is possible to suppress the gap AS from being clogged by the deposit and not functioning as a capacitor (or the capacitance from being fluctuated greatly).

The area of the upper surface of the lower inner peripheral portion of the conductive ring DR facing to the lower surface of the outer peripheral portion of the focus ring FR may be configured to be larger than the area of the side surface of the inner peripheral portion of the conductive ring DR facing to the side surface of the outer peripheral portion of the focus ring FR. Since the capacitance between the lower surface of the outer peripheral portion of the focus ring FR and the upper surface of the lower inner peripheral portion of the conductive ring DR increases, the fluctuation of the capacitance between the focus ring FR and the conductive ring DR may be reduced.

As the example illustrated in FIG. 7, an inclined portion may be formed between the side surface of the inner peripheral portion of the conductive ring DR and the upper surface thereof. By providing the inclined portion, the change of the height between the upper surface of the focus ring FR and the upper surface of the conductive ring DR is alleviated, and the discontinuity of the sheath formed above the conductive ring DR and the focus ring FR may be alleviated.

As the examples illustrated in FIGS. 2 to 7, the upper surface SFb of the conductive ring DR is configured to be higher than the upper surface of the focus ring FR, but the present disclosure is not limited thereto. The upper surface SFb of the conductive ring DR may be configured to be at the same height as the upper surface of the focus ring FR, or to be lower than the upper surface of the focus ring FR.

Figure 8:
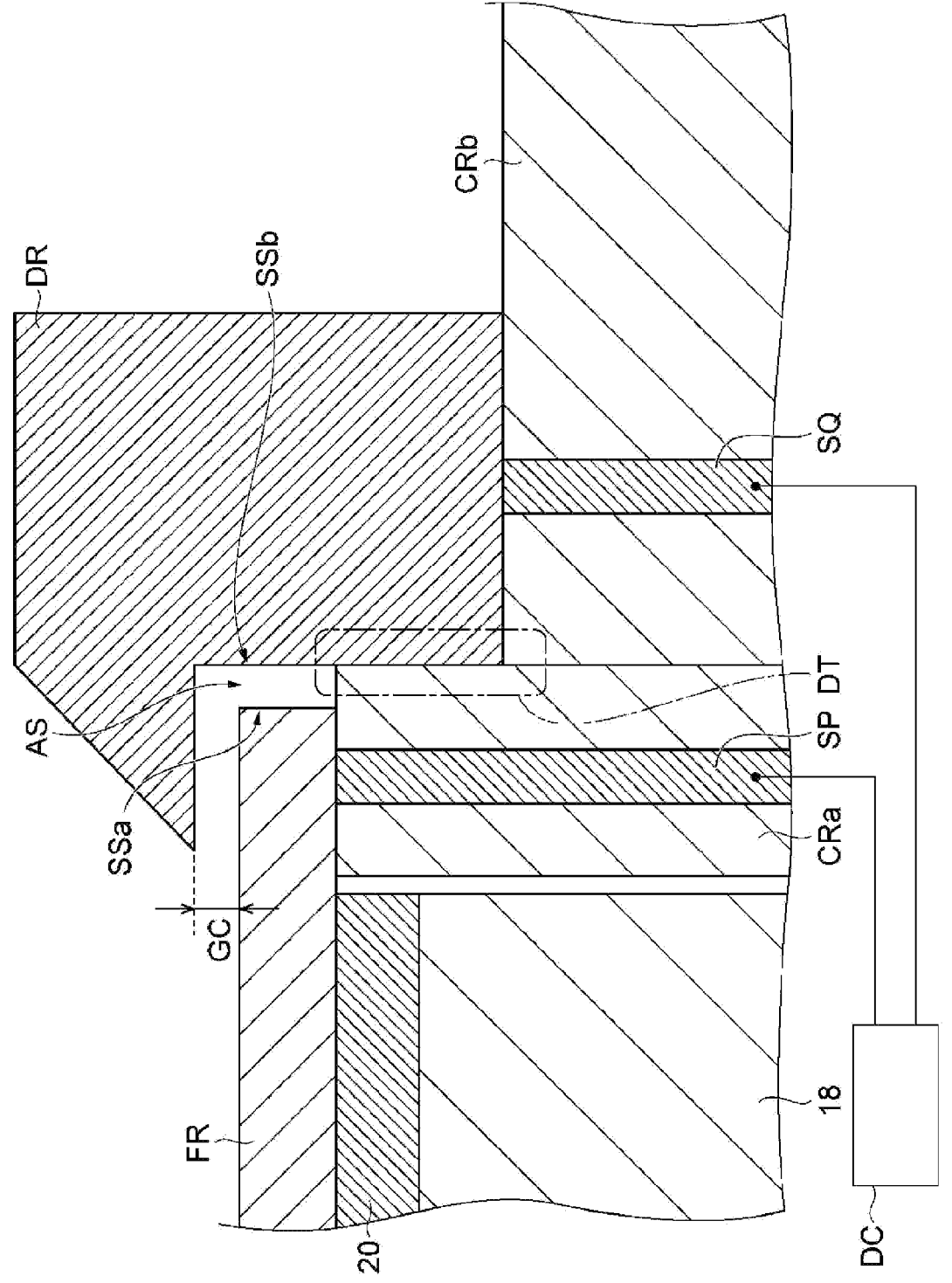
FIG. 8 is a view illustrating yet another example of the configuration of the conductive ring according to the embodiment.

As the example illustrated in FIG. 7, the lower surface of the outer peripheral portion of the focus ring FR and the upper surface of the inner peripheral portion of the conductive ring DR are separated from each other to face each other. As illustrated in FIG. 8, the upper surface of the outer peripheral portion of the focus ring FR and the lower surface of the inner peripheral portion of the conductive ring DR may be configured to be separated from each other to face each other.

In the conductive ring DR illustrated in FIG. 8, the upper portion of the inner peripheral portion protrudes to the inner periphery side. The lower surface of the upper inner peripheral portion of the conductive ring DR that protrudes and the upper surface of the focus ring FR are separated from each other to face each other. Further, the first side surface SSa of the focus ring FR and the second side surface SSb that is the side surface of the lower inner peripheral portion of the conductive ring DR are separated from each other to face each other.

The upper surface SFc of the inner periphery side of the outer cover ring CRb is lower than the upper surface SFa of the inner cover ring CRa, and a step portion serving as the separating portion DT is formed between the inner cover ring CRa and the outer cover ring CRb. Since the second side surface SSb that is the side surface of the lower inner peripheral portion of the conductive ring DR abuts on the step portion (side surface of the outer periphery of the inner cover ring CRa), the second side surface SSb that is the side surface of the upper inner peripheral portion of the conductive ring DR and the first side surface SSa of the focus ring FR are not in contact with each other. Further, the lower surface of the upper inner peripheral portion of the conductive ring DR that protrudes is formed at a position higher than the upper surface of the outer peripheral portion of the focus ring. Therefore, the lower surface of the upper inner peripheral portion of the conductive ring DR and the upper surface of the focus ring are not in contact with each other.

As the example illustrated in FIG. 8, a distance GC between the upper surface of the outer peripheral portion of the focus ring FR and the lower surface of the upper inner peripheral portion of the conductive ring DR may be configured to be smaller than the distance GA between the first side surface SSa and the second side surface SSb. The area of the lower surface of the upper inner peripheral portion of the conductive ring DR facing to the upper surface of the outer peripheral portion of the focus ring FR may be larger than the area of the side surface of the inner peripheral portion of the conductive ring DR facing to the side surface of the outer peripheral portion of the focus ring FR.

As the example illustrated in FIG. 8, since the gap AS is covered with the upper inner peripheral portion of the conductive ring DR, it is possible to suppress the gap AS from being clogged by the deposit and not functioning as a capacitor (or the capacitance from being fluctuated greatly).

As the examples illustrated in FIGS. 7 and 8, the lower surface (upper surface) of the outer peripheral portion of the focus ring FR and the upper surface (lower surface) of the inner peripheral portion of the conductive ring DR are separated from each other to face each other. In addition, the first side surface SSa of the focus ring FR and the second side surface SSb of the conductive ring DR are separated from each other to face each other. However, only the lower surface (upper surface) of the outer peripheral portion of the focus ring FR and the upper surface (lower surface) of the inner peripheral portion of the conductive ring DR may be configured to be separated from each other to face each other.

As the examples illustrated in FIGS. 2 to 8, the focus ring FR is disposed to cover the inner cover ring CRa at the outer periphery side (outer peripheral portion) of the focus ring FR. However, the entire focus ring FR may be disposed on the electrostatic chuck 20 or the base 18. That is, not only the inner periphery side (inner peripheral side) of the focus ring FR, but also the outer periphery side (outer peripheral portion) thereof may be placed on the electrostatic chuck 20 that is the peripheral portion 31*b* of the placing portion 31 or the base 18.

Figure 9:
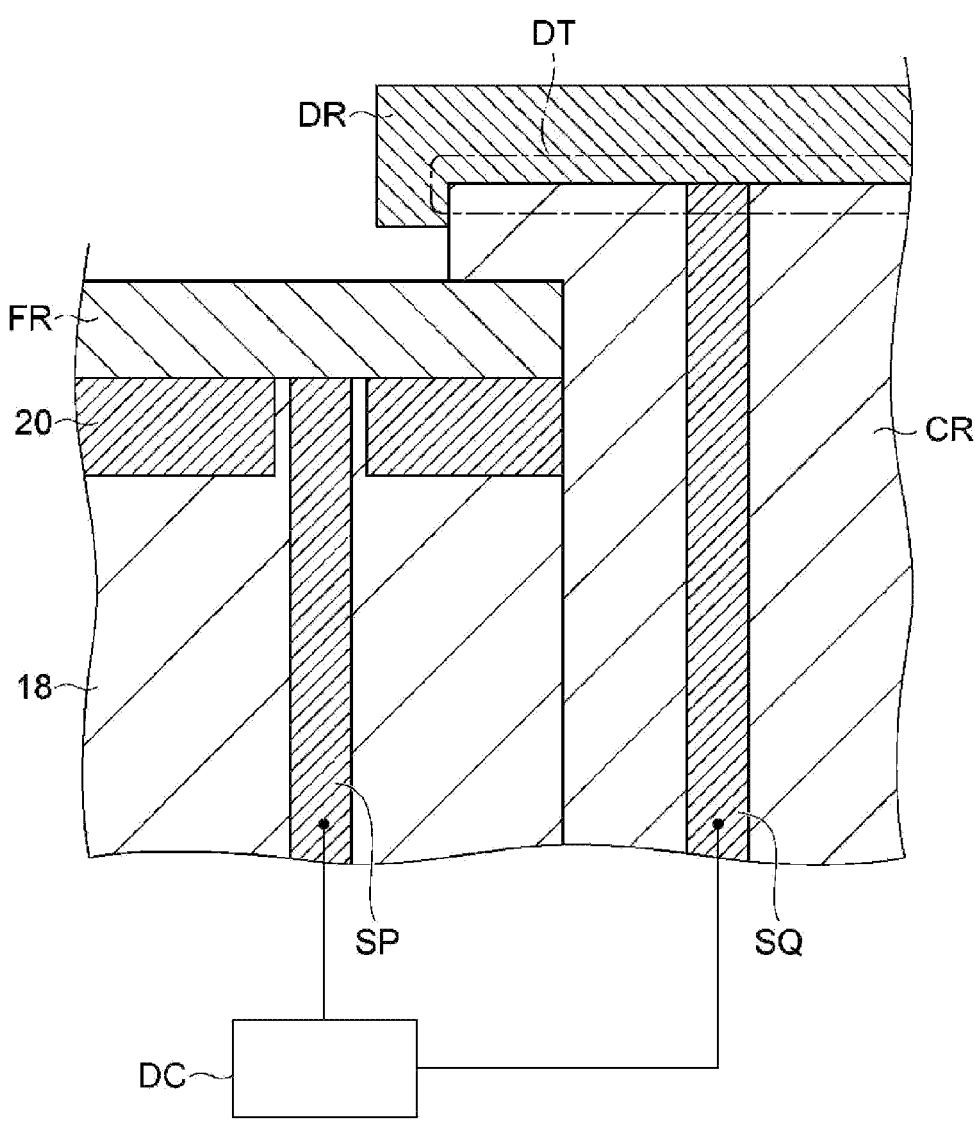
FIG. 9 is a view illustrating another example of the configuration of the conductive ring according to the embodiment.

FIG. 9 illustrates an example configured such that only the upper surface of the outer peripheral portion of the focus ring FR and the lower surface of the inner peripheral portion of the conductive ring DR are separated from each other to face each other. Further, the entire focus ring FR is placed on the electrostatic chuck 20.

The inner peripheral portion of the cover ring CR is placed on the outer peripheral portion of the focus ring FR. The conductive ring DR is placed on the cover ring CR. The inner peripheral portion of the conductive ring DR includes a protruding portion that protrudes downward, and the lower surface (lower surface of the inner peripheral portion) of the protruding portion is separated from the upper surface of the outer peripheral portion of the focus ring FR to face with each other. Since the conductive ring DR is placed on the cover ring CR, the upper surface of the cover ring CR abuts on the lower surface of the outer peripheral portion of the conductive ring DR. That is, the upper surface of the cover ring CR serves as the separating portion DT, and the lower surface of the protruding portion of the conductive ring DR and the upper surface of the outer peripheral portion of the focus ring FR are not in contact with each other. As the example illustrated in FIG. 9, although the protruding portion that protrudes downward is formed in the inner peripheral portion of the conductive ring DR, if a sufficient capacitance can be obtained between the lower surface of the inner peripheral portion of the conductive ring DR and the upper surface of the outer peripheral portion of the focus ring, the protruding portion may not be formed.

Although various embodiments have been described above, the present disclosure is not limited to the embodiments described above, and various omissions, substitutions, and changes may be made. Further, it is possible to combine the elements in different embodiments to form other embodiments.

For example, the plasma processing apparatus 1 according to one embodiment includes a plurality of power supply line SP and a plurality of power supply line SQ. The focus ring FR has a shape extending along the peripheral portion 31*b* of the stage 16. The conductive ring DR has a shape extending to surround the focus ring FR. The plurality of power supply lines SP are disposed to be separated from each other in a circumferential direction of the focus ring FR. The plurality of power supply lines SQ are disposed to be separated from each other in a circumferential direction of the conductive ring DR.

Further, it is possible to have a configuration in which a filter is provided in each of two independent DC power supplies. Specifically, the filter FT1 and the filter FT2 of the DC power supply DC illustrated in FIG. 3, which includes one DC power source DCS, may be applied to the DC power supply DC illustrated in FIG. 4, which includes a plurality of DC power sources (DC power source DCS1 and DC power source DCS2). In this case, the filter FT1 is electrically connected to the focus ring FR via the power supply line SP, and the filter FT2 is electrically connected to the conductive ring DR via the power supply line SQ. The DC power source DCS1 is electrically connected to the focus ring FR via the filter FT1 and the power supply line SP, and the DC power source DCS2 is electrically connected to the conductive ring DR via the filter FT2 and the power supply line SQ.

According to one embodiment, a technique to reduce a potential difference between a focus ring and a conductive member provided in the vicinity of the outer side of the focus ring, which may occur during a plasma processing is provided.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:

a stage having a substrate placing portion on which a substrate is placed, and a peripheral portion surrounding the substrate placing portion;

a focus ring having conductivity and placed on the peripheral portion of the stage;

a cover ring surrounding an outer periphery of the stage and made of a dielectric;

a conductive ring placed on the cover ring;

a radio-frequency power supply coupled to the stage;

a first power supply line electrically connected to the focus ring;

a second power supply line electrically connected to the conductive ring; and

a DC power supply electrically connected to the focus ring via the first power supply line, and electrically connected to the conductive ring via the second power supply line, wherein the DC power supply is configured to apply a same or a different DC voltage to each of the focus ring and the conductive ring, a first surface on an outer periphery of the focus ring and a second surface on an inner periphery of the conductive ring are separated from each other to face each other, the cover ring has a separating portion that separates the focus ring and the conductive ring, and a lower surface of the inner periphery of the conductive ring is positioned below a lower surface of the outer periphery of the focus ring.

2. The plasma processing apparatus according to claim 1, wherein an inner periphery of the focus ring is supported by the peripheral portion of the stage, and the outer periphery of the focus ring covers an upper surface of an inner periphery of the cover ring.

3. The plasma processing apparatus according to claim 1, wherein the focus ring and the conductive ring are capacitively coupled to each other on the first surface and the second surface.

4. The plasma processing apparatus according to claim 1, wherein a distance between the first surface and the second surface is larger than zero, and smaller than a thickness of the focus ring.

5. The plasma processing apparatus according to claim 1, wherein the separating portion is a groove formed on a surface of the cover ring, and a lower surface of the inner periphery of the conductive ring is accommodated in the groove.

6. The plasma processing apparatus according to claim 1, wherein the first surface is a lateral side surface of the outer periphery of the focus ring, and the second surface is a lateral side surface of the inner periphery of the conductive ring.

7. The plasma processing apparatus according to claim 1, wherein the first surface is a lower surface of the outer periphery of the focus ring, and the second surface is an upper surface of the inner periphery of the conductive ring.

8. The plasma processing apparatus according to claim 1, wherein the DC power supply includes a first filter, a second filter, and a DC power source, the first filter is electrically connected to the focus ring via the first power supply line, the second filter is electrically connected to the conductive ring via the second power supply line, the DC power source is electrically connected to the focus ring via the first filter and the first power supply line, and electrically connected to the conductive ring via the second filter and the second power supply line, thereby applying a common DC voltage to the focus ring and the conductive ring, and the first filter and the second filter are configured to block an input of a radio-frequency output from the radio-frequency power supply to the DC power source.

9. The plasma processing apparatus according to claim 1, wherein the DC power supply includes a first DC power source and a second DC power source, the first DC power source is configured to be electrically connected to the focus ring via the first power supply line, thereby applying a DC voltage to the focus ring,

the second DC power source is configured to be electrically connected to the conductive ring via the second power supply line, thereby applying a DC voltage to the conductive ring, and the first DC power source and the second DC power source are configured to output a DC voltage independently of each other.

10. The plasma processing apparatus according to claim 9, further comprising:

a controller configured to control the DC voltage output from each of the first DC power source and the second DC power source so as to reduce a potential difference between the focus ring and the conductive ring.

11. The plasma processing apparatus according to claim 10, wherein the controller is further configured to align a potential of the focus ring and a potential of the conductive ring.

12. A plasma processing apparatus comprising:

a stage having a substrate placing portion on which a substrate is placed, and a peripheral portion surrounding the substrate placing portion;

a focus ring having conductivity and placed on the peripheral portion of the stage;

a cover ring surrounding an outer periphery of the stage and made of a dielectric;

a conductive ring placed on the cover ring;

a radio-frequency power supply coupled to the stage;

a first power supply line electrically connected to the focus ring;

a second power supply line electrically connected to the conductive ring; and a DC power supply electrically connected to the focus ring via the first power supply line, and electrically connected to the conductive ring via the second power supply line, wherein the DC power supply is configured to apply a same or a different DC voltage to each of the focus ring and the conductive ring, a first surface on an outer periphery of the focus ring and a second surface on an inner periphery of the conductive ring are separated from each other to face each other, the cover ring has a separating portion that separates the focus ring and the conductive ring, and the separating portion is a step configured to abut on the second surface of the inner periphery of the conductive ring, and formed on a surface of the cover ring.

13. The plasma processing apparatus according to claim 12, wherein the first surface is a lateral side surface of the outer periphery of the focus ring, and the second surface is a lateral side surface of the inner periphery of the conductive ring.

14. The plasma processing apparatus according to claim 12, wherein the DC power supply includes a first DC power source and a second DC power source, the first DC power source is configured to be electrically connected to the focus ring via the first power supply line, thereby applying a DC voltage to the focus ring, the second DC power source is configured to be electrically connected to the conductive ring via the second power supply line, thereby applying a DC voltage to the conductive ring, and the first DC power source and the second DC power source are configured to output a DC voltage independently of each other.

15. A plasma processing apparatus comprising:

a stage having a substrate placing portion on which a substrate is placed, and a peripheral portion surrounding the substrate placing portion;

a focus ring having conductivity and placed on the peripheral portion of the stage;

a cover ring surrounding an outer periphery of the stage and made of a dielectric;

a conductive ring placed on the cover ring;

a radio-frequency power supply coupled to the stage;

a first power supply line electrically connected to the focus ring;

a second power supply line electrically connected to the conductive ring; and a DC power supply electrically connected to the focus ring via the first power supply line, and electrically connected to the conductive ring via the second power supply line, wherein the DC power supply is configured to apply a same or a different DC voltage to each of the focus ring and the conductive ring, a first surface on an outer periphery of the focus ring and a second surface on an inner periphery of the conductive ring are separated from each other to face each other, the cover ring has a separating portion that separates the focus ring and the conductive ring, the first power supply line comprises a plurality of first power supply lines, and the second power supply line comprises a plurality of second power supply lines, the focus ring has a shape extending along the peripheral portion of the stage, the conductive ring has a shape extending to surround the focus ring, and the plurality of first power supply lines are disposed to be separated from each other in a circumferential direction of the focus ring, and the plurality of second power supply lines are disposed to be separated from each other in a circumferential direction of the conductive ring.

16. The plasma processing apparatus according to claim 15, wherein the separating portion is a groove formed on a surface of the cover ring, and a lower surface of the inner periphery of the conductive ring is accommodated in the groove.

17. The plasma processing apparatus according to claim 15, wherein the DC power supply includes a first DC power source and a second DC power source, the first DC power source is configured to be electrically connected to the focus ring via the first power supply line, thereby applying a DC voltage to the focus ring, the second DC power source is configured to be electrically connected to the conductive ring via the second power supply line, thereby applying a DC voltage to the conductive ring, and the first DC power source and the second DC power source are configured to output a DC voltage independently of each other.

18. The plasma processing apparatus according to claim 17, further comprising:

a controller configured to control the DC voltage output from each of the first DC power source and the second DC power source so as to reduce a potential difference between the focus ring and the conductive ring.

* * * * *